United States Patent [19]

Gregorich et al.

[11] Patent Number: 4,591,761
[45] Date of Patent: May 27, 1986

[54] RELAXATION OSCILLATOR SYNCHRONIZER FOR PULSED LASER OPERATION

[75] Inventors: David P. Gregorich, New Brighton; Hans W. Mocker, Minneapolis, both of Minn.

[73] Assignee: Honeywell, Inc., Minneapolis, Minn.

[21] Appl. No.: 569,704

[22] Filed: Jan. 10, 1984

[51] Int. Cl.[4] .................... H05B 37/00; H05B 39/00
[52] U.S. Cl. ..................... 315/170; 372/25; 372/29; 315/171; 315/173; 315/175; 315/209 CD; 315/240; 307/267; 328/68
[58] Field of Search ............ 315/170, 171, 172, 173, 315/174, 175, 209 CD, 237, 238, 240; 307/267, 268; 372/25, 29, 38, 31; 328/66, 68

[56] References Cited

U.S. PATENT DOCUMENTS

| | | | |
|---|---|---|---|
| 3,154,721 | 10/1964 | Sommeria | 315/172 |
| 3,626,213 | 12/1971 | Waaben | 307/267 |
| 3,646,395 | 2/1972 | DePratti | 315/241 P |
| 4,005,333 | 1/1977 | Nichols | 315/173 |
| 4,071,806 | 1/1978 | List | 315/150 |
| 4,105,952 | 8/1978 | Tulip | 372/29 X |
| 4,128,788 | 12/1978 | Lowther | 315/172 |
| 4,385,261 | 5/1983 | Kogelschatz et al. | 315/173 |
| 4,398,129 | 8/1983 | Logan | 315/237 |
| 4,403,173 | 9/1983 | Mayer | 315/209 CD |
| 4,479,467 | 10/1984 | Burrows et al. | 315/209 CD |

Primary Examiner—Saxfield Chatmon
Attorney, Agent, or Firm—William T. Udseth

[57] ABSTRACT

Pulse stability is provided to a pulsed gas filled electrical discharge device by an electrical circuit including first and second electrical energy storage means, with the energy stored in the first storage means being substantially greater than the energy stored in the second storage means. A first voltage corresponding to the energy stored on the first storage means is applied to the input of the gas filled device. A second voltage corresponding to the energy stored on the second storage means is periodically switched to combine with the first voltage and be input to the gas filled device. The period for switching is precisely controlled, preferably with a piezoelectric crystal, and is selected to combine the first and second voltages just before the first voltage reaches the natural breakdown voltage of the gas within the gas filled device.

19 Claims, 6 Drawing Figures

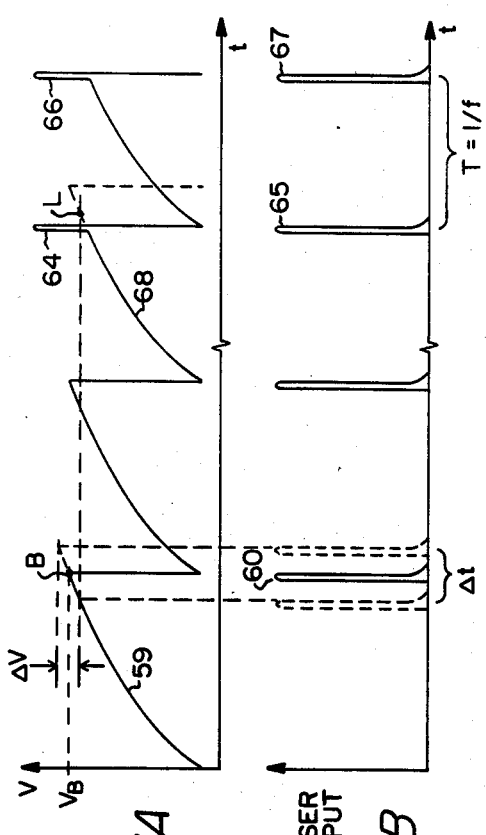
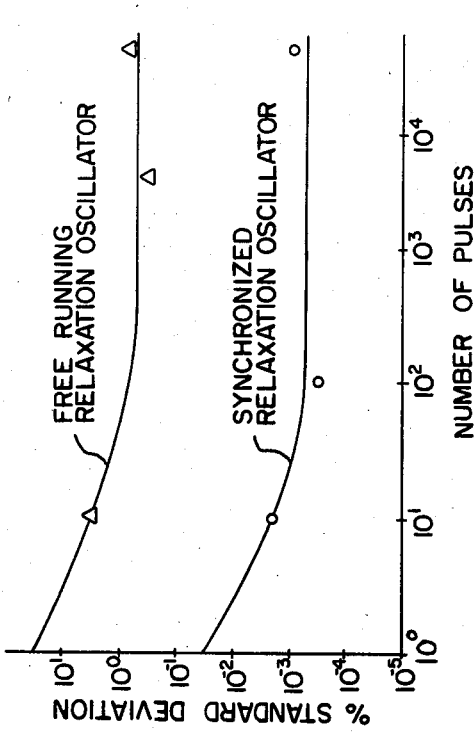
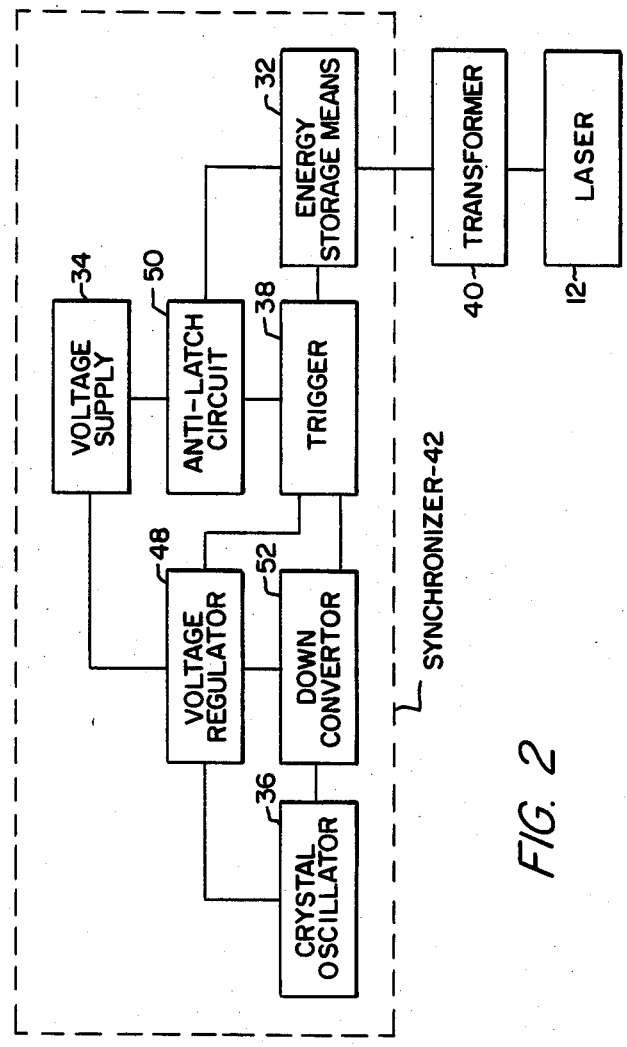

RELAXATION OSCILLATOR SYNCHRONIZER FOR PULSED LASER OPERATION

BACKGROUND OF THE INVENTION

1. FIELD OF THE INVENTION

This invention relates to electrical circuits which include a crystal oscillator for controlling a charging network and which are coupled to gas filled electrical discharge devices, particularly gas lasers.

2. DESCRIPTION OF THE PRIOR ART

For many applications, a pulsed output from a gas filled electrical discharge device, and particularly from a gas laser, exhibiting a high repetition rate and excellent pulse stability is desirable. However, a simple, light weight, inexpensive means of providing such an output which also employs a DC power source has not heretofore been achieved.

In the past, pulsed outputs have been produced by laser excitation flashlamps. A common method of producing a pulsed flashlamp output is the "simmer" method. That is, a DC potential is impressed on the flashlamp electrodes to significantly reduce (i.e., by several orders of magnitude) the impedance of the gas within the flashlamp. Thereafter, a relatively large voltage pulse is periodically superimposed on the DC potential so that the sum of the DC potential and the pulse potential exceeds the breakdown voltage of the gas. The flashlamp in turn discharges.

In the simmer technique the DC potential can not be too close to the breakdown voltage or sporadic discharges can occur. Therefore the pulse potential is a large percentage of the breakdown voltage.

It is more difficult to switch a large potential quickly onto a system than it is to switch a small potential. The switching of a large potential with precise timing can be achieved only at the cost of substantially increased circuit complexity. Further, switching a large potential electrically stresses the circuitry and therefore reduces the reliability of devices incorporating such circuitry.

Further, the simmer technique cannot be directly employed with a gas laser because the DC level is substantial and will cause some ionization of the gas amplifying medium, thus lowering the population of the upper states of the medium. With depletion, the population inversion for proper lasing action upon excitation is reduced.

Electrical circuits adapted to provide periodic discharges of gas filled devices are disclosed in U.S. Pat. Nos. 3,646,395 to N. P. DePratti, 4,071,806 to W. F. List and 4,105,952 to J. Tulip.

The DePratti patent shows an optically pumped laser which utilizes a discharge from a high voltage capacitor into a laser-exciting flashlamp. The capacitor discharge is controlled by the switching action of a hydrogen thyratron tube. The thyratron switch closes when each voltage pulse in the pulse train is applied to it.

The List patent discloses a self triggering circuit (i.e., all additional or auxiliary voltages and currents are generated intrinsically in the circuit) for a gas laser. An active semiconductor device responsive to dv/dt or di/dt is used as the self triggering switch.

In Tulip, a high repetition discharge system for molecular gas lasers is disclosed, wherein sparks positioned adjacent to the discharge electrodes provide both ionization for the supression of arcing and a high repetition rate switching means for the energy storage circuit.

Disadvantages remain with these three patented concepts with regard to achieving a high rate, highly pulse stablized pulsed output from a gas filled discharge device. DePratti uses a gas filled thyraton which is inherently slow compared to a semiconductor switch and his device switches all the discharge voltage onto the flashlamp.

List uses a semiconductor switch but again switches all the energy for stimulating the laser.

Tulip uses sparks between electrode pins as a switch but also switches the entire discharge voltage from an energy storage means.

It would be further advantageous to have a gas laser operated as a relaxation oscillator, i.e., an oscillator whose fundamental frequency is determined by the time of charging or discharging a capacitor or coil through a resistor. A laser relaxation oscillator would provide a pulsed output without the other cumbersome and/or slow pulser networks commonly employed such as a thyratron, a spark gap or a magnetic coil.

A $CO_2$ waveguide laser operated as a relaxation oscillator is disclosed in "Self-Pulsing by Discharge Relaxation Oscillation in the $CO_2$ Waveguide Laser", J. Zimmerman and O. L. Gaddy, IEEE Journal Quant. Electronics, page 92, January 1974. However, Zimmerman and Gaddy disclose no means for minimizing "jitter" (i.e., variation in the period between output pulses) and providing pulse stability. Discharge times in the Zimmerman and Gaddy laser were subject to inaccuracies in the discharging of the stray capacitance, which was the capacitance component of the RC circuit employed therein. Zimmerman and Gaddy acknowledge that considerable jitter in the pulse repetition was observed.

SUMMARY OF THE INVENTION

The present invention is an electrical circuit for providing input electrical signals to a gas filled electrical discharge device, comprising: first means for storing electrical energy which provides a first electrical signal upon the application thereto of an electrical energy source, wherein the first electrical signal varies with time and is continuously applied to the gas filled device; second means for storing electrical energy which provides a second electrical signal which varies with time upon the application of an electrical energy souce to the second means; means for generating a third electrical signal which varies with time upon the application thereto of an electrical energy source; and means for selectively combining the first and second electrical signals to produce a fourth electrical signal where the combining means is responsive to the generating means and the fourth electrical signal is applied to the gas filled device.

BRIEF DESCRIPTION OF THE DRAWINGS

FIG. 1 is a schematic of the present invention.

FIG. 2 is a block diagram of the synchronizer of the present invention and interface to a gas filled device.

FIG. 4A is a graph showing the charging voltage of the present invention as a function of time before and after the synchronizer is employed.

FIG. 4B is a graph showing the laser output as a function of time of a gas laser utilizing the present invention, both before and after the synchronizer is employed.

FIG. 5 is a graph showing actual data of the pulse stability of the output of the device of FIG. 1 both with and without the snychronizer.

DESCRIPTION OF THE PREFERRED EMBODIMENT

Figure 3:
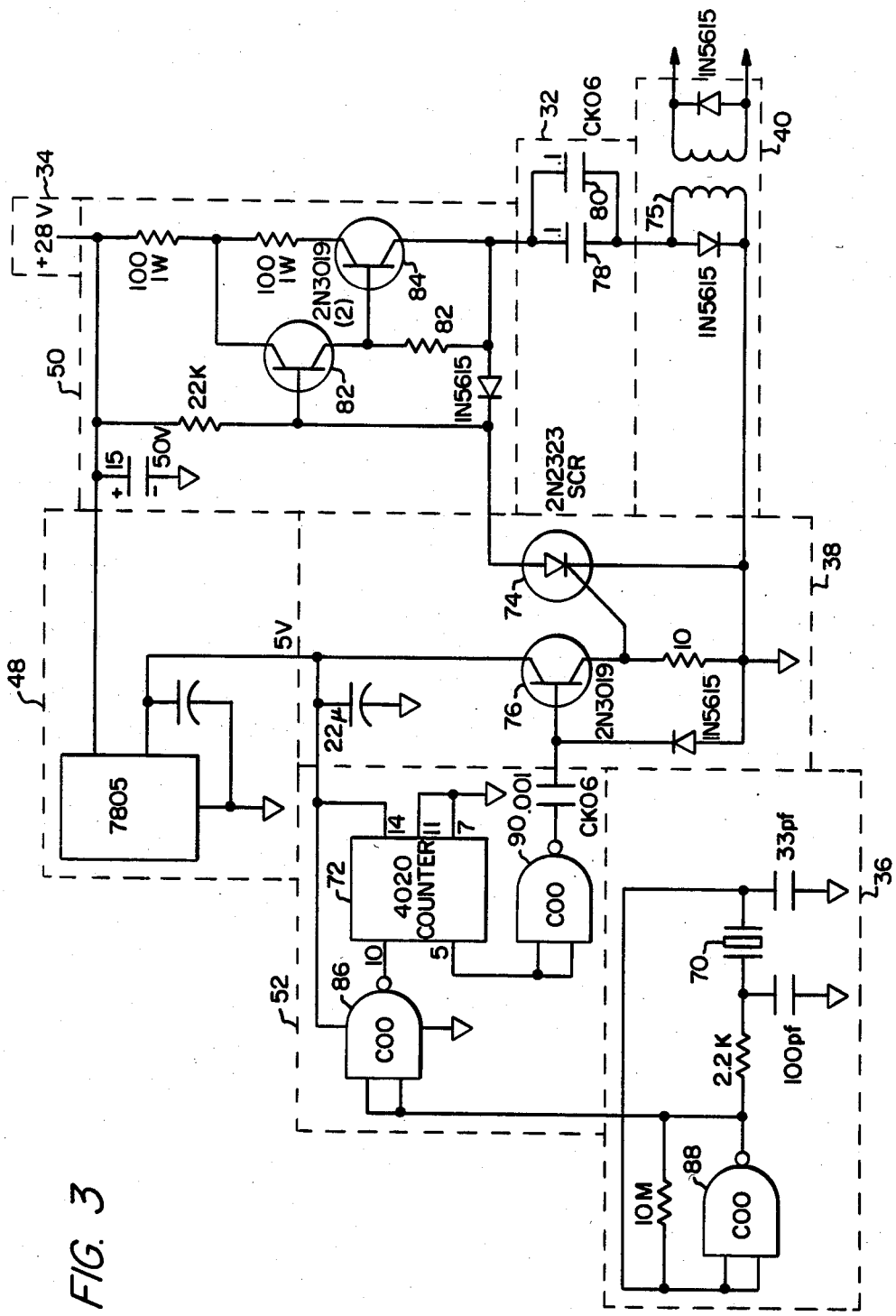
FIG. 3 is the detailed schematic of a convenient synchronizer circuit.

Device 10 includes (see FIGS. 1 and 2) a gas filled electrical discharge device, e.g., laser 12; first means for storing electrical energy adapted to provide a first electrical signal which is not constant, e.g., resistors 14 and 16, capacitors 18 and 20, and conductors 22, 24, 26 and 28, upon the application thereto of a source of electrical energy, e.g., voltage supply 30; second means for storing electrical energy adapted to provide a second electrical signal, e.g., energy storage means 32, upon the application thereto of a source of electrical energy, e.g. voltage supply 34; means for generating a third electrical signal which is not constant, e.g., crystal oscillator 36, voltage regulator 48 and down converter 52, upon the application thereto of a source of electrical energy, again voltage supply 34; means for selectively combining the first and second electrical signals to produce a fourth electrical signal, the combining means being responsive to the means for generating the third electrical signal, e.g., trigger 38 and transformer 40.

As used herein, "gas filled electrical discharge device" includes any device having a means for confining a gas, a gas therein and means for applying an electrical potential across at least a portion of the gas. A "gas laser" includes any device having two, separated partially reflecting and transmitting means defining an electromagnetic resonating cavity, a gas amplifying medium disposed between the separated means and a means of adding energy to the gas to stimulate electromagnetic wave emissions from the device.

Second energy storage means 32, voltage supply 34, crystal oscillator 36 and trigger 38 are all included in synchronizer 42 of FIG. 1. Synchronizer 42 is electrically connected to transformer 40 by conductors 44 and 46. Voltage sources 30 and 34 could be combined with appropriate voltage regulation for synchronizer 42.

Synchronizer 42 (see FIG. 2) may further include voltage regulator 48, anti-latch circuit 50 and down converter 52.

By way of further example, FIG. 3 provides a convenient electrical schematic of synchronizer 42 and transformer 40. Areas of the schematic of FIG. 3 generally corresponding to the blocks in FIG. 2 are marked by a dashed boundary.

In operation, device 10 of FIG. 1, without synchronizer 42 coupled thereto by transformer 40, functions as a free running relaxation oscillator. That is, an RC circuit is provided by resistors 14 and 16, and capacitors 18 and 20, and conductors 22, 24, 26 and 28. DC supply 30 charges capacitors 18 and 20. Preferably resistors 14 and 16 are the same, as are capacitors 18 and 20. Capacitors 18 and 20 are selected so that the natural breakdown voltage of the gas medium within laser 12 will be reached before they are fully charged. Thus capacitors 18 and 20 will charge to the natural breakdown voltage at which time a discharge will occur between cathode 54 and anodes 56 and 58 (i.e, both "legs" of laser 12 will experience electrical discharge).

The discharge in turn excites the gaseous medium to create the necessary population inversion for lasing. Preferably laser 12 is a $CO_2$ waveguide laser. Capacitors 18 and 20 will be substantially discharged by the electrical discharge within laser 12. Thereafter capacitors 18 and 20 will begin recharging and the cycle described above will be repeated.

The left side of FIG. 4A shows the general charging, discharging cycle of device 10 without synchronizer 42 coupled onto conductor 28 by transformer 40. In this configuration, an uncertainty ($\Delta V$) exists in the natural breakdown voltage ($V_B$ corresponding to point B on charging curve 59) of the gas or plasma in laser 12. This uncertainty is due to varying amounts of pre-ionization of the plasma in laser 12, appearing as a vestige of, for example, a previous electrical discharge.

Jitter is the corresponding timing uncertainty ($\Delta t$) in the firing of laser 12. As the lefthand side of FIG. 4B depicts, $\Delta t$ is determined by the times corresponding to the bounds of $\Delta V$. The period T between consecutive laser output pulses 60 and 62 can vary by $\Delta t$. The resultant jitter without synchronizer 42 is on the order of 20 to 30% of T.

With synchronizer 42 coupled into device 10, jitter is virtually eliminated. As shown in the upper right of FIG. 4A, consecutive voltage pulses 64 and 66 from synchronizer 42 are superimposed on charging curve 68 just prior to the natural breakdown of the plasma in laser 12. Note that curve 68 has not reached point L, the lower limit of $\Delta V$, at the time pulse 64 is superimposed on curve 68. It is convenient to combine the voltage of a pulse such as pulse 64 with the voltage on capacitor 18 or 20 by placing the voltages in series as shown in FIG. 1. The magnitude of pulses 64 or 66 is chosen so that the sum of that magnitude and the voltage on capacitor 18 or 20 readily exceeds the natural breakdown voltage of the plasma in laser 12. Thus laser 12 will experience electrical discharge at a period determined by synchronizer 42. Assuming predictability in lasing action in response to an electrical discharge, a very stable pulsed output will be generated by laser 12 (see pulses 65 and 67 in FIG. 4B).

The period of the pulses 64 and 66 from synchronizer 42 can itself be made very stable. This is preferably accomplished by employing a crystal oscillator including a piezoelectric crystal, switching only about 5 to 10 percent of the total voltage applied across the electrodes of laser 12 into the RC network of device 10 and using a fast semiconductor switch such as a silicon controlled rectifier (SCR).

FIG. 3 is a convenient circuit which incorporates the above desired features. The various component identification numbers in FIG. 3 are standard industry codes and will be recognized by those skilled in the art. Piezoelectric crystal 70 is configured in a crystal oscillator 36. The high frequency output of crystal oscillator 36 is reduced by down converter 52 (and particularly counter 72) to output a signal which has a reduced frequency (e.g., up to 1/16384 of crystal 70's operating frequency). SCR 74 receives the output of down converter 52 after amplification by transistor 76. Transistor 76 amplifies its input signal to a level sufficient to switch SCR 74. When SCR 74 is switched, it impresses a voltage signal on the primary of transformer 75. The impressed voltage signal is the voltage held on capacitors 78 and 80. Capacitors 78 and 80 are charged by voltage supply 34. Transistors 82 and 84 prevent SCR 74 from latching and holding on by turning off momentarily when SCR 74 is switched on and cutting the current to SCR 74 from voltage supply 34. Voltage regulator 48 provides the correct voltage level (e.g., 5 V) to control down converter 52, crystal oscillator 36 including crystal 70 and transistor-amplifier 76. NAND gate 86 serves to square up the signal from crystal oscillator 36. NAND gate 86 is the feedback gain element of oscillator 36 and NAND gate 90 is a buffer and driver element.

FIG. 5 displays actual data generated with the circuits of FIGS. 1 and 4. FIG. 5 compares pulse stability for device 10 operating with and without synchronizer 42 coupled thereto. The top line in FIG. 5 is data generated when device 10 was operated as a free running relaxation oscillator and the bottom line depicts data generated with synchronizer 42 active. Power supply 34 was 28 volts and transformer 40 was selected so that a 2 kV train of pulses (i.e., pulses 64 and 66) was superimposed on the RC network charging curve 68. The energy delivered by the pulses 64 and 66 from synchronizer 42 was about 10 percent of the total energy delivered to laser 12. The results of FIG. 5 show an improvement of nearly $10^3$ in frequency stability. For the synchronized laser device 10, a pulse to pulse stability of 0.03 percent was achieved for a $CO_2$ waveguide laser operating at 6.2 KHz. The entire electronics for laser 12 in device 10, excluding power supplies 30 and 34, was incorporated on a $2'' \times 2''$ card weighing less than three ounces including transformer 40. Potentially this circuit could be miniaturized to a fingernail size chip.

What is claimed is:

1. An electrical circuit for providing input electrical signals to a gas filled electrical discharge device, comprising:
   first means for storing electrical energy, said first storage means being adapted to provide a first electrical signal upon the application thereto of an electrical energy source, wherein said first electrical signal is not constant and is continuously input to said gas filled device;
   second means for storing electrical energy, said second storage means being adapted to provide a second electrical signal upon the application thereto of an electrical energy source;
   means for generating a third electrical signal upon the application thereto of an electrical energy source wherein said third electrical signal is not constant; and
   means for selectively combining said first and second electrical signals to produce a fourth electrical signal, wherein said means for selectively combining is responsive to said means for generating said third electrical signal and wherein said fourth electrical signal is input to said gas filled device.

2. The electrical circuit of claim 1 wherein said first storage means includes an RC circuit.

3. The electrical circuit of claim 2 wherein said RC circuit includes first and second branches connected in parallel at first and second nodes, said first branch includes a first resistor and a first capacitor and said second branch includes a second resistor and the second capacitor, and wherein said first resistor and first capacitor are each directly electrically connected to a third node and said second resistor and said second capacitor are each directly electrically connected to a fourth node.

4. The electrical circuit of claim 3 wherein said gas filled device has first, second and third input terminals, and wherein said first terminal is electrically connected to said first node, said second terminal is directly electrically connected to said fourth node and said third terminal is directly electrically connected to said third node.

5. The electrical circuit of claim 1 wherein said means for generating said third electrical signal includes a piezoelectric crystal.

6. The electrical circuit of claim 1 wherein said means for selectively combining said first and second signals includes a silicon controlled rectifier adapted to operate as a switch.

7. The electrical circuit of claim 1 wherein the energy of said second electrical signal is less than 15 percent of the energy of said fourth electrical signal at the time said first and second electrical signals are combined.

8. The electrical circuit of claim 1 wherein said gas filled device has a natural breakdown voltage for the gas therein and said natural breakdown voltage has a range of voltage uncertainty having a lower voltage limit, said first electrical signal has a first nonconstant voltage associated therewith, and said fourth electrical signal is input to said gas filled device before said first voltage reaches said lower voltage limit.

9. An electrical circuit for providing input electrical signals to a gas laser, comprising:
   first means for storing electrical energy, said first storage means being adapted to provide a first electrical signal upon the application thereto of an electrical energy source, wherein said first electrical signal is not constant and is applied to said gas laser;
   second means for storing electrical energy, said second storage means being adapted to provide a second electrical signal upon the application thereto of an electrical energy source;
   means for generating a third electrical signal upon the application thereto of an electrical energy source wherein said third electrical signal is not constant; and
   means for selectively combining said first and second electrical signals to produce a fourth electrical signal wherein said means for selectively combining is responsive to said means for generating said third electrical signal and wherein said fourth electrical signal is applied to said gas laser.

10. The electrical circuit of claim 9 wherein said first storage means includes an RC circuit.

11. The electrical circuit of claim 9 wherein said RC circuit includes first and second branches connected in parallel at first and second nodes, said first branch includes a first resistor and a first capacitor and said second branch includes a second resistor and a second capacitor, and wherein said first resistor and first capacitor are each directly electrically connected to a third node and said second resistor and second capacitor are each directly electrically connected to a fourth node.

12. The electrical circuit of claim 11 wherein said gas laser has first, second and third input terminals, and wherein said first terminal is electrically connected to said first node, said second terminal is directly electrically connected to said fourth node and said third terminal is directly electrically connected to said third node.

13. The electrical circuit of claim 9 wherein said means for generating said third electrical signal includes a piezoelectric crystal.

14. The electrical circuit of claim 9 wherein said means for selectively combining said first and second electrical signals includes a silicon control rectifier adapted to operate as a switch.

15. The electrical circuit of claim 9 wherein the energy of said second electrical signal is less than 15 percent of the energy of said fourth electrical signal at the time said first and second electrical signals are combined.

16. The electrical circuit of claim 9 wherein said gas laser has a natural breakdown voltage for the gas therein and said natural breakdown voltage has a range of voltage uncertainty having a lower voltage limit, said first electrical signal has a first nonconstant voltage associated therewith and said fourth electrical signal is applied to said gas laser before said first voltage reaches said lower voltage limit.

17. An electrical circuit for providing input electrical signals to a gas laser, comprising:
first means for storing electrical energy, said first storage means being adapted to provide a first electrical signal upon the application thereto of an electrical energy source, wherein said first electrical signal is not constant and is input to said laser, and wherein said first storage means includes a first resistor and a first capacitor;
second means for storing electrical energy, said second storage means being adapted to provide a second electrical signal upon the application thereto of an electrical energy source, said second storage means including a second capacitor;
means for generating a third electrical signal wherein said third electrical is not constant and said generating means includes a piezoelectric crystal; and
means for selectively combining said first and second electrical signals to produce a fourth electrical signal, wherein said means for selectively combining is responsive to said generating means and includes a solid state switching means, and wherein said fourth electrical signal is input to said laser.

18. The electrical circuit of claim 17 wherein said first storage means further includes a second resistor and a third capacitor.

19. An electrical circuit for providing input electrical signals to a gas laser, wherein said gas laser includes a gas having a natural breakdown voltage and said natural breakdown voltage has a range of voltage uncertainty having a lower voltage limit, comprising:
first means for storing energy, said first storage means being adapted to provide a first voltage signal upon the application thereto of an electrical energy source, wherein said first voltage signal is not constant, is continuously applied to said laser, and has a magnitude which is less than the magnitude of said lower voltage limit at least some of the time;
second means for storing energy, said second storage means being adapted to provide a second voltage signal upon the application thereto of an electrical energy source;
means for generating a third voltage signal wherein said third voltage signal is not constant; and
means for selectively combining said first and second voltage signals to produce a fourth voltage signal, wherein said means for selectively combining is responsive to said generating means and combines said first and second voltage signals only when the magnitude of said first voltage signal is less than the magnitude of said lower voltage limit.

* * * * *